(12) United States Patent
Huang (10) Patent No.: US 7,245,492 B2
(45) Date of Patent: Jul. 17, 2007

(54) HEAT-DISSIPATING MODULE AND STRUCTURE THEREOF

(75) Inventor: Yu-Nien Huang, Chung Li (TW)

(73) Assignee: Quanta Computer Inc., Tao Yuan Shien (TW)

( * ) Notice: Subject to any disclaimer, the term of this patent is extended or adjusted under 35 U.S.C. 154(b) by 314 days.

(21) Appl. No.: 11/009,419

(22) Filed: Dec. 10, 2004

(65) Prior Publication Data
US 2005/0190538 A1 Sep. 1, 2005

(30) Foreign Application Priority Data
Feb. 27, 2004 (TW) .............................. 93105073 A (51) Int. Cl.
*H05K 7/20* (2006.01)
(52) U.S. Cl. .................... 361/697; 165/80.3; 165/185; 165/122; 257/722; 361/703
(58) Field of Classification Search .................. 165/76, 165/78, 80.3, 185; 257/722; 361/697, 703
See application file for complete search history.

(56) References Cited

U.S. PATENT DOCUMENTS 5,558,155 A * 9/1996 Ito ............................. 165/80.3
6,324,061 B1 * 11/2001 Kinoshita et al. ........... 361/709
6,590,770 B1 * 7/2003 Rogers et al. .............. 361/697

FOREIGN PATENT DOCUMENTS

| CN | 2585412 Y | 11/2003 |
|---|---|---|
| CN | 2603514 Y | 2/2004 |
| TW | 332723 | 10/1986 |
| TW | 425053 | 10/1987 |
| TW | 545621 | 11/1990 |

* cited by examiner

*Primary Examiner*—Gregory D Thompson
(74) *Attorney, Agent, or Firm*—Thomas, Kayden, Horstemeyer & Risley (57) ABSTRACT

A heat-dissipating structure. The heat-dissipating structure comprises a plurality of first and second conductive plates. Each first conductive plate has a first base surface, a first reference surface and a first main disturbing portion disposed on the first base surface and the first reference surface, and each second conductive plate has a second base surface, a second reference surface and a first sub disturbing portion disposed on the second base surface and the second reference surface. A middle passage, formed between two adjacent first and second conductive plates by facing the second base surface of the second conductive plate to the first reference surface of the first conductive plate, provides airflow passing therethrough with uniform flow resistance.

27 Claims, 10 Drawing Sheets

FIG. 8

HEAT-DISSIPATING MODULE AND STRUCTURE THEREOF

BACKGROUND

The invention relates to a heat-dissipating module, and in particular to a heat-dissipating module comprising a plurality of passages to provide airflow passing therethrough with uniform flow resistance.

Computer functions are integrally systematized on the same circuit or motherboard, decreasing space available in the housing thereof for convection and heat dissipation. Thus, forced convection by an electrical fan is employed to increase flow rate of air for dissipating heat generated therein. Broad narrowband noise and narrowband noise, however, increased as maximum static pressure and flow rate of airflow increase.

Figure 1:
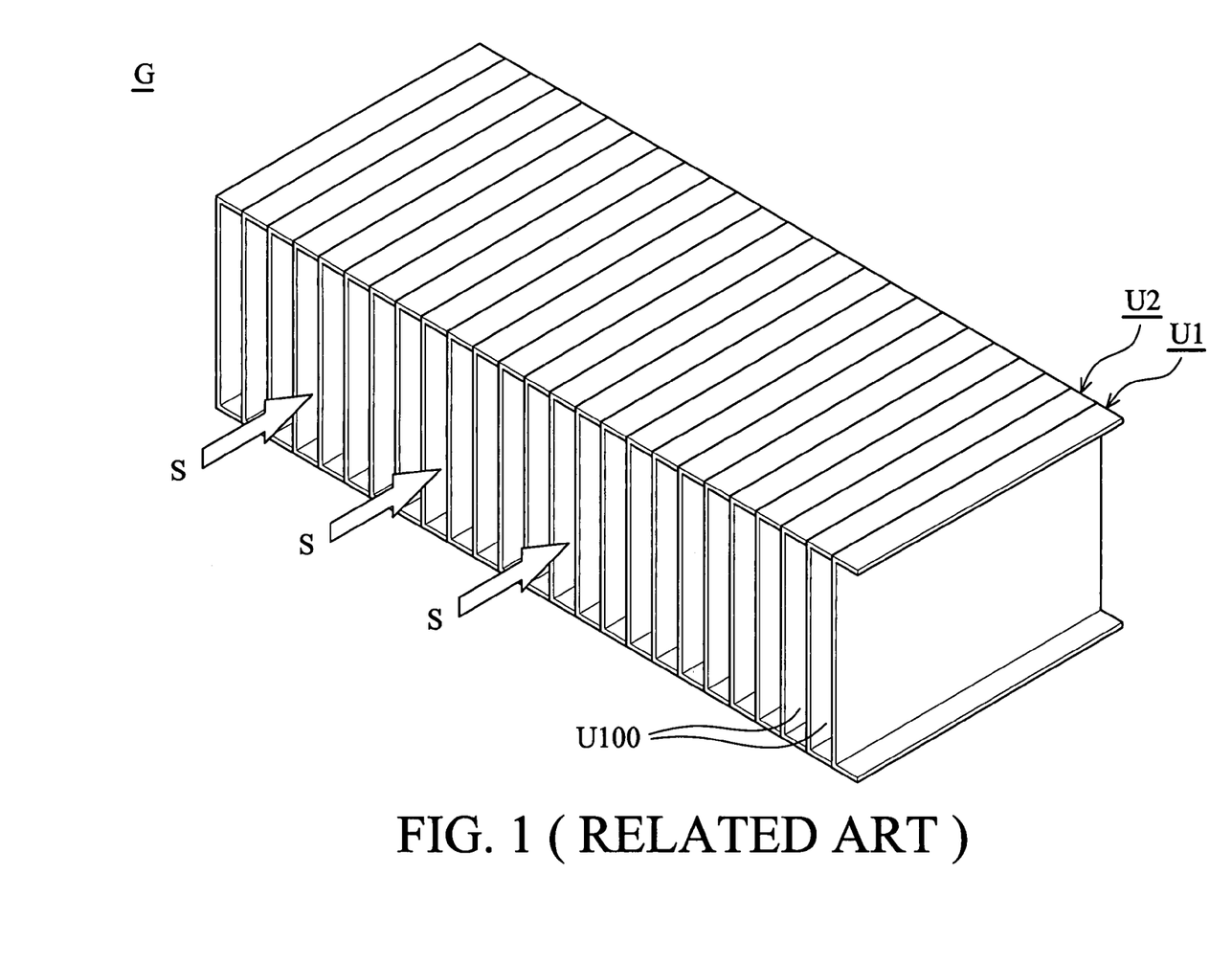
FIG. 1 is a perspective view of a conventional heat-dissipating unit (G) comprising a plurality of fins (U1, U2) arranged in parallel.
Figure 2A:
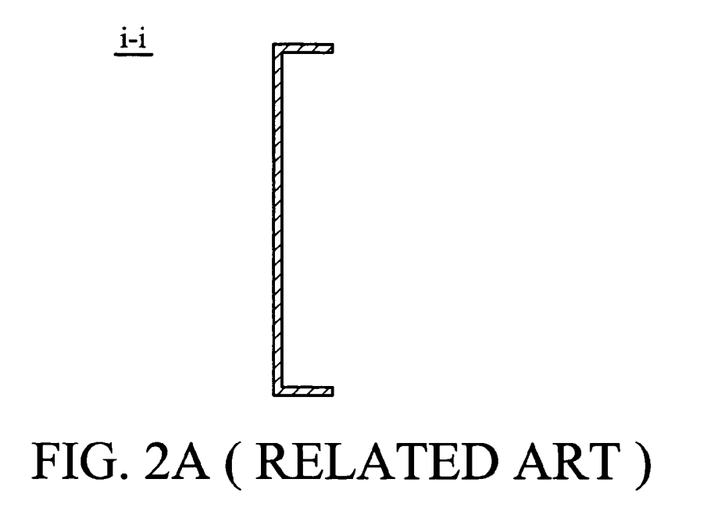
FIG. 2A is a perspective view of the fin (U1) of the dissipating unit (G) of FIG. 1.
Figure 2B:
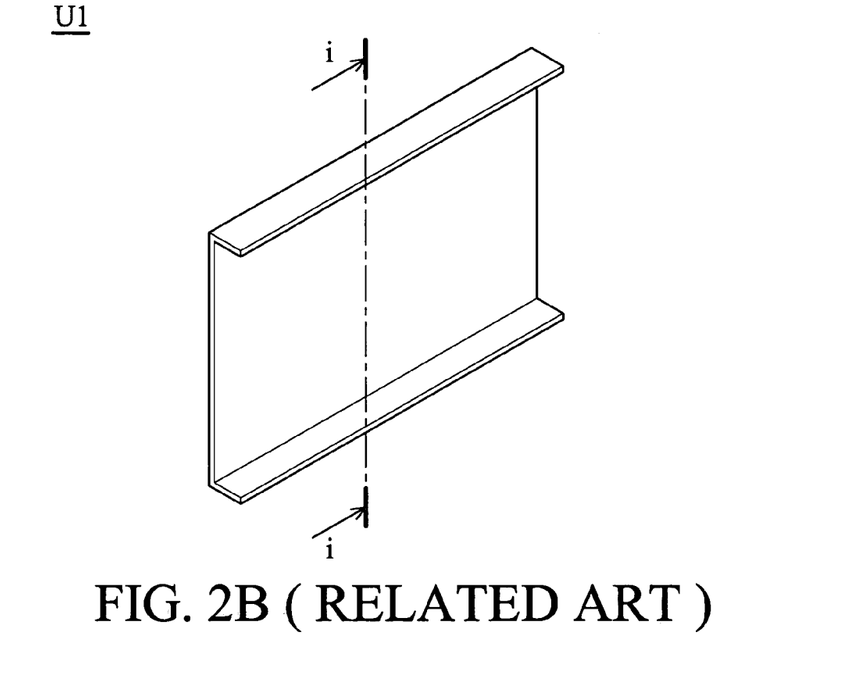
FIG. 2B is a sectional view of the fin (U1) along line (A-A) of FIG. 2A.

FIG. 1 is a perspective view of a conventional heat-dissipating unit G. The heat-dissipating unit G has a plurality of metallic fins U1, U2 arranged in parallel to form a plurality of channels U100 therebetween. FIG. 2A is a perspective view of the fin U1 of the dissipating unit G, and FIG. 2B is a sectional view of the fin U1 along line A-A of FIG. 2A. The U-shaped fin U1, same as the fin U2, has uniform thickness and a smooth surface on each side thereof.

As the heat-dissipating unit G is disposed next to or on a heat source such as a CPU (not shown), airflow S passes through the channels U100 directing heat on the fins U1, U2 to the exterior. Velocity distribution of airflow, as it is presented in a laminar flow, for example, is substantially the same as Poiseullie flow located near the side of the fin U1 to generate a corresponding designated noise spectrum. When a high-power fan is employed or the number of the fans is increased to elevate the volume and velocity of airflow, however, airflow with higher noise spectrum may be generated

SUMMARY

Accordingly, an object of the invention is to provide a heat-dissipating module with a plurality of passages formed therein to overcome the limitations of the above described fin structure.

The heat-dissipating structure comprises a plurality of conductive plates and a plurality of disturbing portions disposed on the conductive plate. Each conductive plate has a base surface, a reference surface and an original thickness between the base surface and the reference surface. Each disturbing portion has a disturbing surface connected to the base surface, a disturbing surface connected to the reference surface and a formed thickness between the disturbing surfaces, and the formed thickness is substantially equal to the original thickness. A middle passage is formed between two adjacent conductive plates by facing the base surface of a first conductive plate to the reference surface of the neighboring conductive plate.

As airflow passes through the passages formed by the conductive plates, the boundary layer of airflow is changed by the disturbing portions to obtain uniform flow resistance therethrough. Thus, time and distance for the leading edge of the airflow, average convection co-efficiency and heat-dissipating efficiency increase.

A detailed description is given in the following embodiments with reference to the accompanying drawings.

DESCRIPTION OF THE DRAWINGS

The invention can be more fully understood by reading the subsequent detailed description and examples with references made to the accompanying drawings, wherein.

DETAILED DESCRIPTION

The impeller of the invention is applicable to different types of fan structures or modules for dissipating heat from a heat source such as a CPU, or other electronic components that generate heat.

Figure 3:
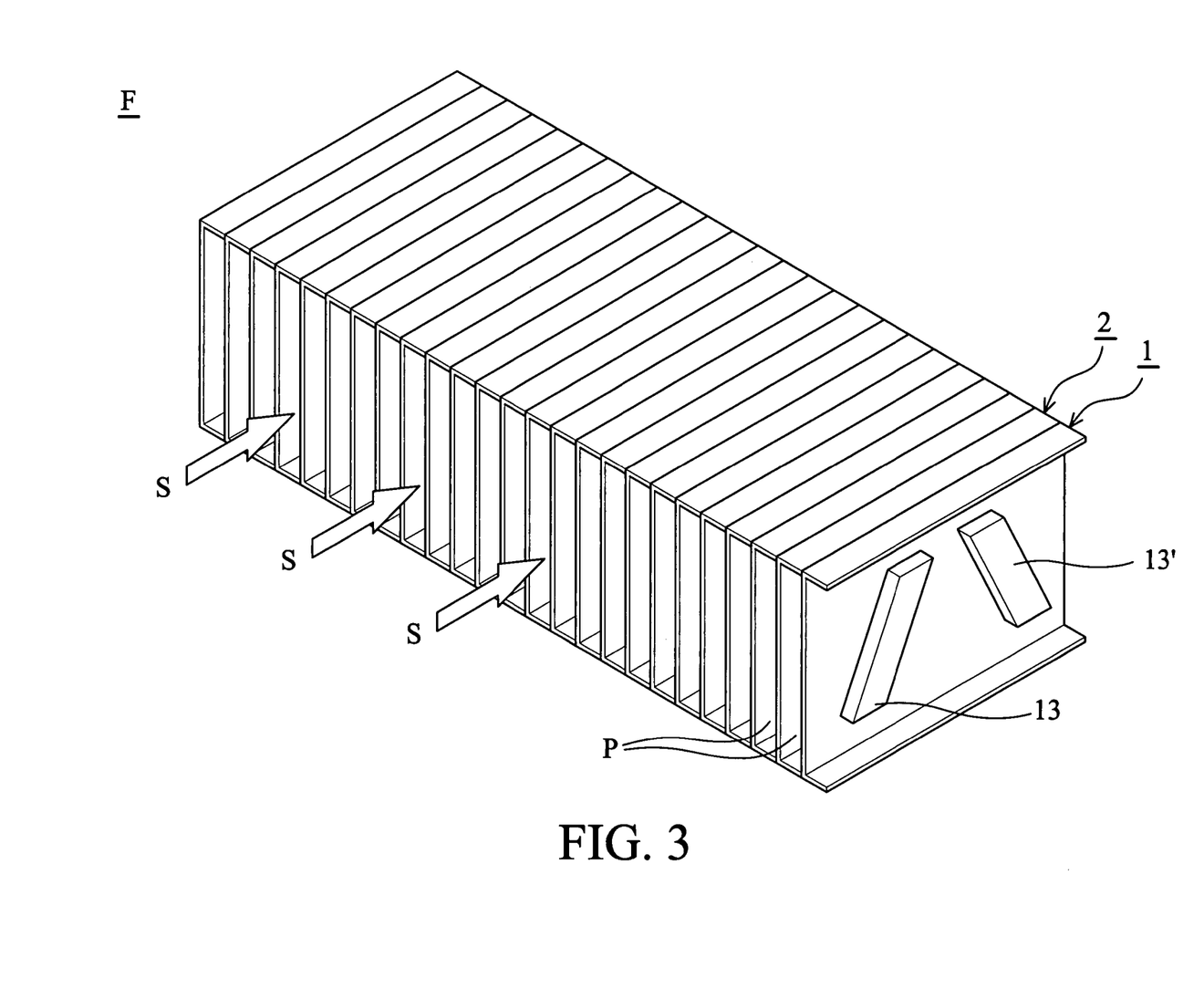
FIG. 3 is a perspective view of a heat-dissipating structure (F) comprising a plurality of first and second conductive plates (1), (2) arranged in parallel.

Referring to FIG. 3, a heat-dissipating structure F of the invention comprises a plurality of first and second conductive plates 1 and 2 and a plurality of first main disturbing portion and the sub disturbing portion 13 and 13', but here only one first main disturbing portion 13 and one first sub disturbing portion 13' are shown on the first conductive plate 1.

The heat-dissipating structure F is a stacked multi-layer structure comprising the first and second conductive plates 1 and 2 in parallel, and each first and each second conductive plate 1 and 2 is substantially rectangular, and a plurality of middle passages P are formed between the adjacent first and second conductive plates 1 and 2. Thus, airflow S passes through the heat-dissipating structure F via the middle passages P to dissipate heat therefrom.

The first main disturbing portion and the sub disturbing portion 13 and 13' are spaced substantially apart in an angle α and disposed on the first conductive plate 1. In this embodiment, the first main disturbing portion and the sub disturbing portion 13 and 13' are integrally formed on the first conductive plate 1 by embossing technique, i.e., the first main disturbing portion and the sub disturbing portion 13 and 13' are extruded from the first conductive plate 1. Additionally, the first and second conductive plates 1 and 2 have the same structure and comprise the same material such as aluminum and copper.

Figure 4:
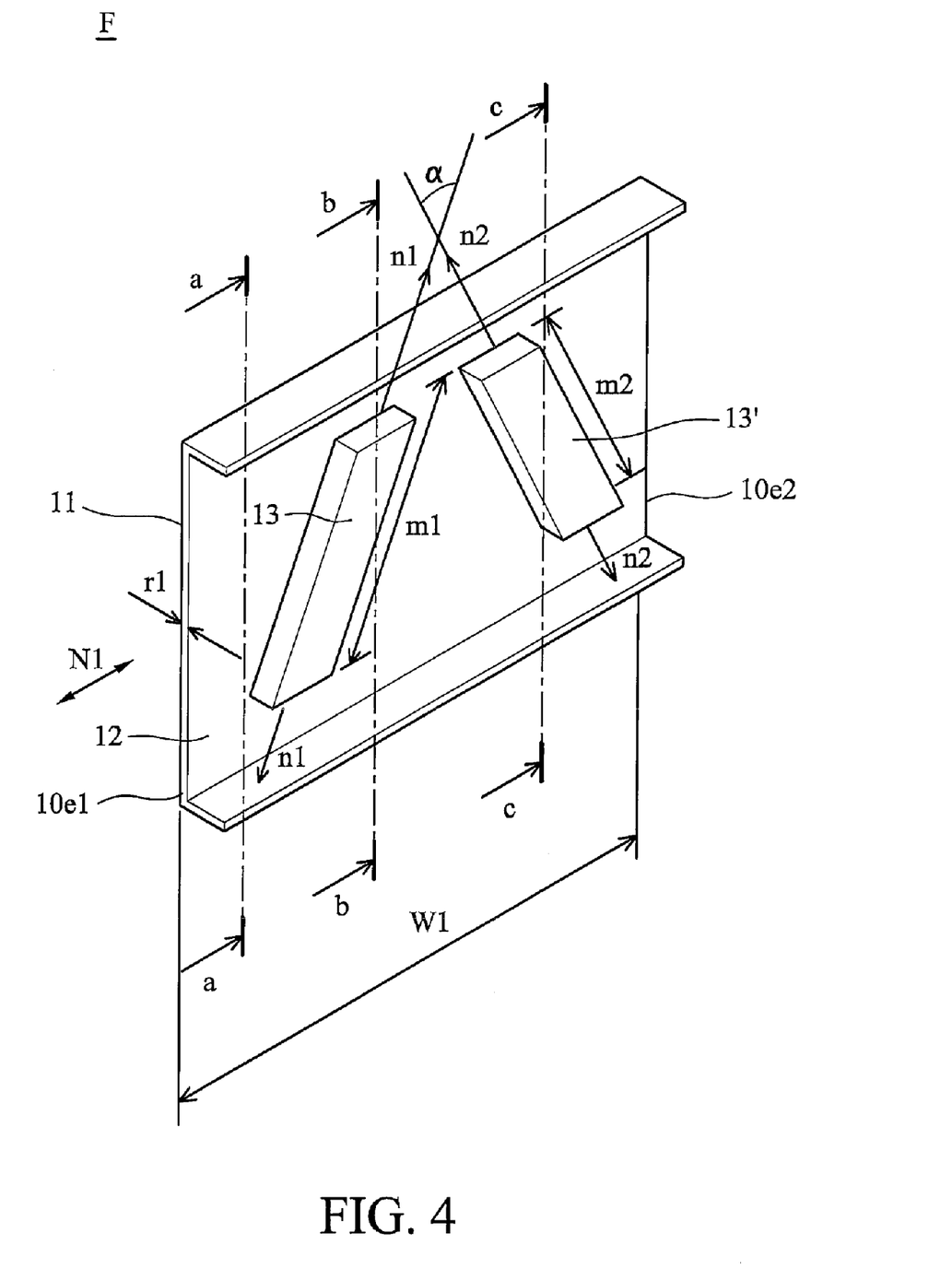
FIG. 4 is a perspective view of the first conductive plates (1) of the heat-dissipating structure (F) of FIG. 3.

In FIG. 4, the first conductive plate 1 comprises a first base surface 11, a first reference surface 12, a first distal end 10e1, a second distal end 10e2 and a first passage length W1. The first main disturbing portion and the sub disturbing portion 13 and 13' are formed from the first base surface 11 and the first reference surface 12 by embossing process, and a first original thickness r1 is between the first base surface 11 and the first reference surface 12. That is to say, the first original thickness r1 is the same as the thickness of the metal sheet when deformed. The first passage length W1 measured by the long side of the first conductive plates 1 extends in a first longitudinal direction N1. Note that the first main disturbing portion and the sub disturbing portion 13 and 13' are located between the first and second distal ends 10e1 and 10e2, but the first main disturbing portion and the sub disturbing portion 13 and 13' are not connected to the first and second distal ends 10e1 and 10e2.

During the embossing process, the first main disturbing portion and the sub disturbing portion 13 and 13' are partially and integrally formed on the first conductive plate 1, extruded on the first reference surface 12 and indented from the first base surface 11. In this embodiment, the first main disturbing portion and the sub disturbing portion 13 and 13' are substantially rectangular, and the first main disturbing portion and the sub disturbing portion 13 and 13' have axial lines n1 and n2, substantially arranged in a V-shape.

The first main disturbing portion 13 has a first disturbing length m1 extending in the predetermined first axial direction n1 unparallel to the first longitudinal direction N1. The first sub disturbing portion 13' has a second disturbing length m2 extending in the predetermined second axial direction n2 unparallel to the first longitudinal direction N1. The first axial direction n1 of the first main disturbing portion 13 and the second axial direction n2 of the first sub disturbing portion 13' are intersected at an angle α.

Figure 5A:
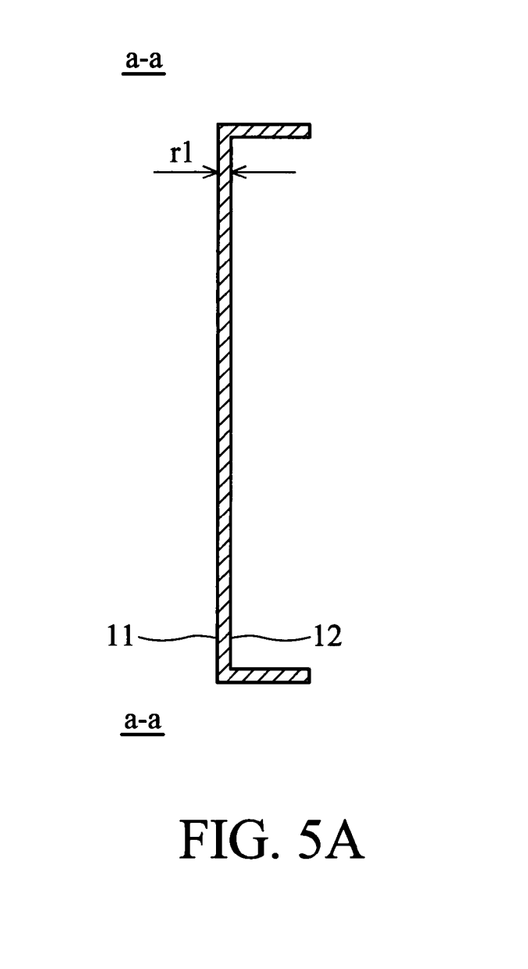
FIG. 5A is a sectional view of the first conductive plates (1) along line (a-a) of FIG. 4.
Figure 5B:
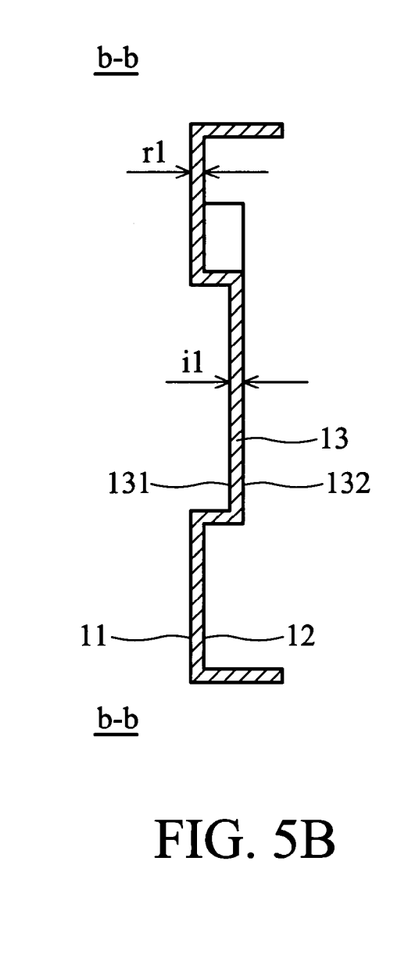
FIG. 5B is a sectional view of the first conductive plates (1) along line (b-b) of FIG. 4.
Figure 5C:
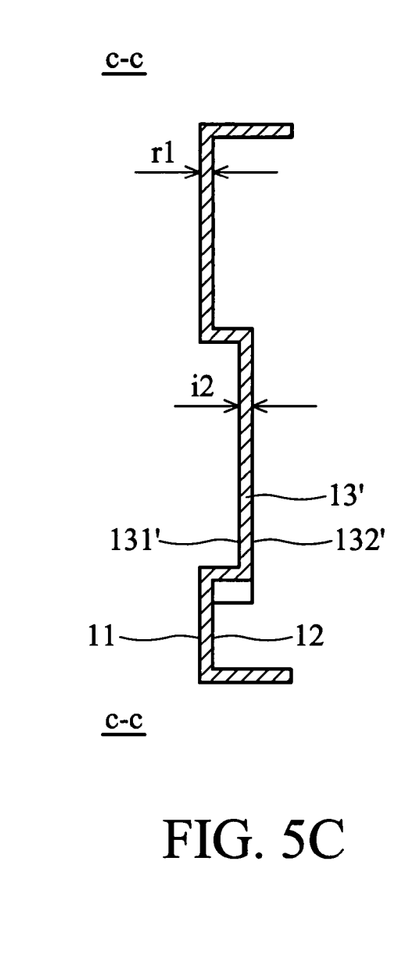
FIG. 5C is a sectional view of the first conductive plates (1) along line (c-c) of FIG. 4.

FIGS. 5A, 5B and 5C are three sectional views of the first conductive plates 1 along lines a-a, b-b and c-c of FIG. 4, respectively. The first original thickness r1 in FIG. 5A, the thickness of the metal sheet, is a thickness relatively measured from the first base surface 11 to the first reference surface 12.

As shown in FIG. 5B, the first main disturbing portion 13 comprises a first disturbing surface 131 connected to the first base surface 11, a second disturbing surface 132 connected to the first reference surface 12 and a first formed thickness i1 between the first and second disturbing surfaces 131 and 132. The first formed thickness i1 is substantially equal to the first original thickness r1. That is to say, the first main disturbing portion 13 has a sectional thickness equal to the first original thickness r1 of the first conductive plates 1 under the embossing process.

As shown in FIG. 5C, the first sub disturbing portion 13' comprises a third disturbing surface 131' connected to the first base surface 11, a fourth disturbing surface 132' connected to the first reference surface 12 and a second formed thickness i2 between the third and fourth disturbing surfaces 131' and 132'. The second formed thickness i2 is substantially equal to the first original thickness r1. That is to say, the first sub disturbing portion 13' has a sectional thickness equal to the first original thickness r1 of the first conductive plates 1 under the embossing.

Figure 6A:
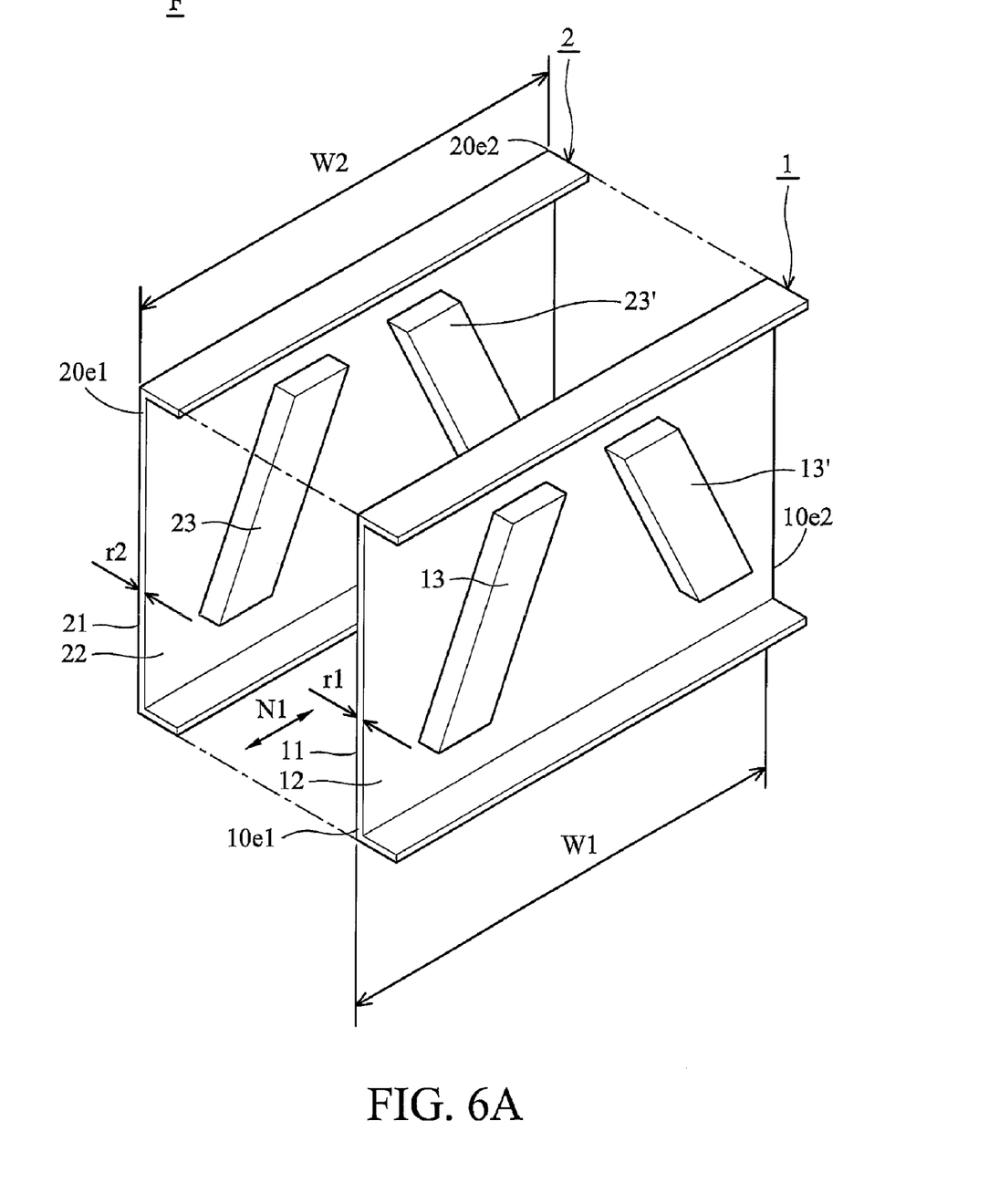
FIG. 6A is a perspective view of the separated first and second conductive plates (1) and (2)

Referring to FIG. 6A, the second conductive plate 2, having the same structure as the first conductive plate 1, comprises a second base surface 21, a second reference surface 22, a third distal end 20e1, a fourth distal end 20e2, a second main disturbing portion 23, a second sub disturbing portion 23', a second passage length W2 and a second original thickness r2, i.e., the second main disturbing portion and the sub disturbing portion 23 and 23' are respectively equal to the first main disturbing portion and the sub disturbing portion 13 and 13', the second original thickness r2 is equal to the first original thickness r1, and the second passage length W2 is equal to the first passage length W1. The second reference surface 22 of the second conductive plate 2 is relatively opposite to the first base surface 11 of the first conductive plate 1. Note that the second main disturbing portion and the sub disturbing portion 23 and 23' are located between the third and fourth distal ends 20e1 and 20e2, but the second main disturbing portion and the sub disturbing portion 23 and 23' are not connected to the third and fourth distal ends 20e1 and 20e2.

Figure 6B:
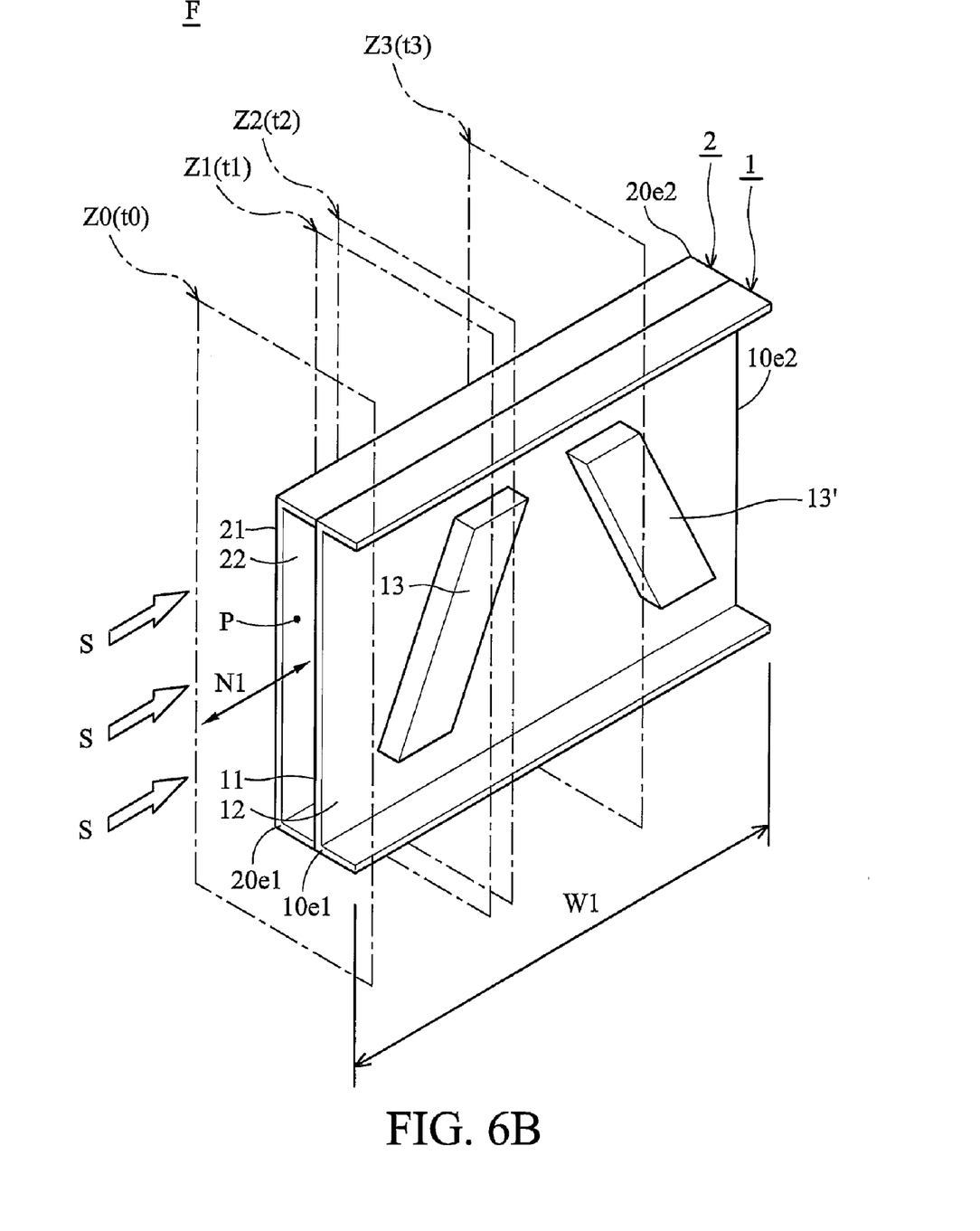
FIG. 6B is a perspective view of the assembled first and second conductive plates (1) and (2)

As the first and second conductive plates 1 and 2 are assembled in FIG. 6B, a middle passage P is formed between the adjacent first and second conductive plates 1 and 2, i.e., a rectangular middle passage P is substantially formed by the second reference surface 22 of the second conductive plate 2 and the first base surface 11 of the first conductive plate 1. Thus, airflow S passes through the middle passage P of the adjacent first and second conductive plates 1 and 2 along a first longitudinal direction N1.

FIGS. 7A, 7B, 7C and 7D are four sectional views of the stacked first and second conductive plates 1 and 2 along planes Z0, Z1, Z2, Z3 of FIG. 6B, correspondingly and sequentially showing the airflow S passing through the middle passage P at an initial time t0, a first time t1, a second time t2 and a third time t3.

Figure 7A:
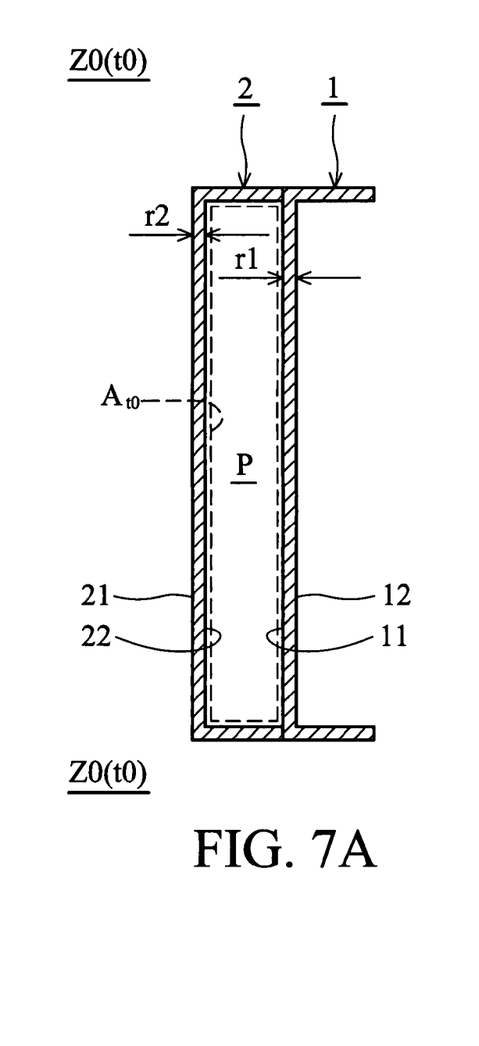
FIG. 7A is a sectional view of the assembled first and second conductive plates (1) and (2) along plane (Z0) of FIG. 6B, wherein a middle passage (P) is formed between the adjacent first and second conductive plates (1) and (2), and an airflow passes therethrough at an initial time (t0), relative to the first and second conductive plates (1) and (2)

The position of the plane Z0, cutting neither the first main/sub disturbing portions 13/13' nor the second main/sub disturbing portion 23/23' of FIG. 6B and correspondingly the airflow S passing through the middle passage P at the initial time t0, is perpendicular to the first and second conductive plates 1 and 2 presenting same sectional area therebetween. In FIG. 7A, a dotted line At0 between the first and second conductive plates 1 and 2 represent an initial effective area of the middle passage P at the initial time t0.

The position of the plane Z1, cutting the first main disturbing portion 13 and second main disturbing portion 23 of FIG. 6B as well as correspondingly the airflow S passing through the middle passage P at the first time t1, is perpendicular to the first and second conductive plates 1 and 2 presenting same sectional area therebetween. The first formed thickness i1 between the first and second disturbing surfaces 131 and 132 of the first main disturbing portion 13, and the first formed thickness i1' between the third and fourth disturbing surfaces 231 and 232 of the second main disturbing portion 23.

Figure 7B:
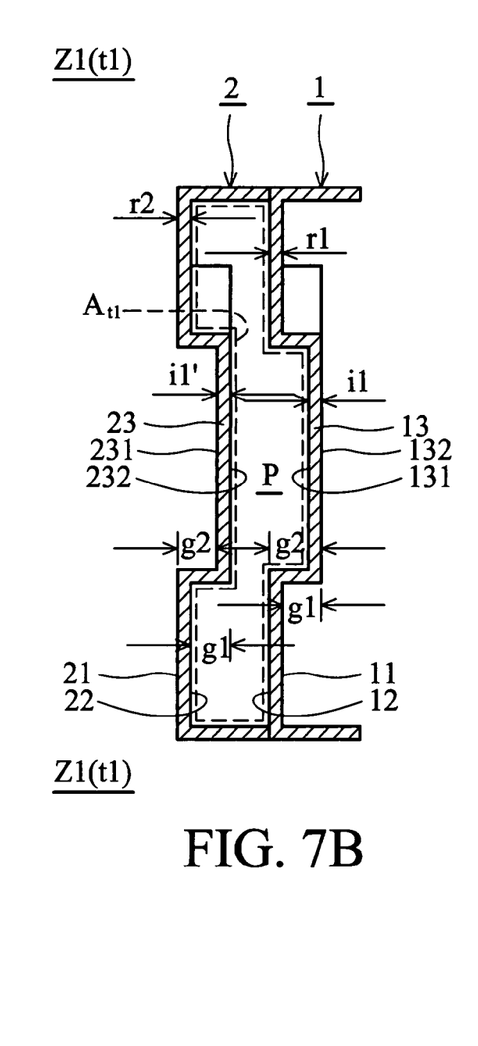
FIG. 7B is a sectional view of the assembled first and second conductive plates (1) and (2) along plane (Z1) of FIG. 6B, wherein the airflow passes therethrough at a first time (t1), relative to a first main disturbing portion (13) of the first conductive plates (1) and a second main disturbing portion (23) of the second conductive plates (2)

In this embodiment, the first formed thickness i1 is equal to the first formed thickness i1'. That is to say, the first formed thickness i1, the first formed thickness i1', the first original thickness r1 and the second original thickness r2 are the same. In FIG. 7B, a dotted line At1 between the first and second conductive plates 1 and 2 represent a first effective area of the middle passage P at the initial time t1.

It is noted that the first main disturbing portion 13 has an extruded distance g1 existing between the first base surface 11 and the second disturbing surface 132 and an indented distance g2 existing between the first reference surface 12 and the first disturbing surface 131. Additionally, the second main disturbing portion 23 has an extruded distance g1 existing between the second reference surface 22 and the fourth disturbing surface 232 and an indented distance g2 existing between the second base surface 21 and the third disturbing surface 231. The extruded distance g1 is substantially the same as the indented distance g2.

Figure 7C:
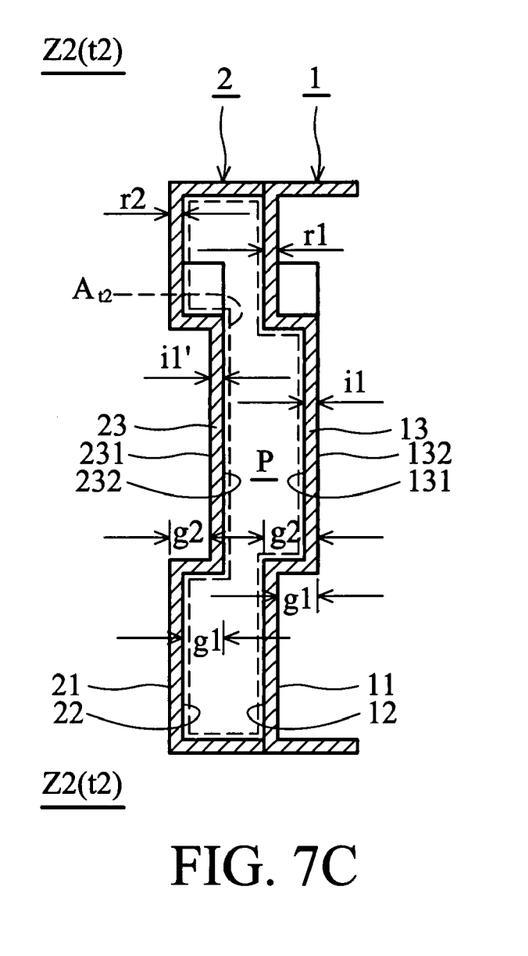
FIG. 7C is a sectional view of the assembled first and second conductive plates (1) and (2) along plane (Z2) of FIG. 6B, wherein the airflow passes therethrough at a second time (t2), relative to the first main disturbing portion (13) of the first conductive plates (1) and the second main disturbing portion (23) of the second conductive plates (2)

The position of the plane Z2, cutting the first main disturbing portion 13 and second main disturbing portion 23 in FIG. 6B as well as correspondingly the airflow S passing through the middle passage P at the second time t2 longer than the first time t1, is perpendicular to the first and second conductive plates 1 and 2 presenting same sectional area therebetween. In FIG. 7C, a dotted line At2 between the first and second conductive plates 1 and 2 represent a second effective area of the middle passage P at the second time t2.

Figure 7D:
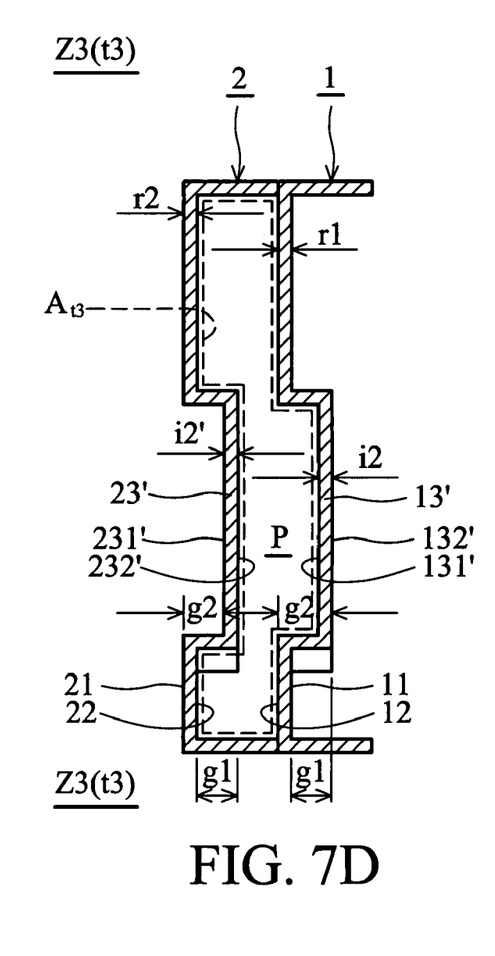
FIG. 7D is a sectional view of the assembled first and second conductive plates (1) and (2) along plane (Z3) of FIG. 6B, wherein the airflow passes therethrough at a third time (t3), relative to the first main disturbing portion (13) of the first conductive plates (1) and the second main disturbing portion (23) of the second conductive plates (2)

The position of the plane Z3, cutting the first sub disturbing portion 13' and the second sub disturbing portion 23' in FIG. 6B as well as correspondingly the airflow S passing through the middle passage P at the third time t3 longer than the first time t2, is perpendicular to the first and second conductive plates 1 and 2 presenting same sectional area therebetween. In FIG. 7D, a dotted line At3 between the first and second conductive plates 1 and 2 represent a third effective area of the middle passage P at the initial time t3.

It is noted that the first sub disturbing portion 13' is provided with the extruded distance g1 existing between the first base surface 11 and the fourth disturbing surface 132' and the indented distance g2 existing between the first reference surface 12 and the third disturbing surface 131'. Additionally, the second sub disturbing portion 23' is provided with the extruded distance g1 existing between the second reference surface 22 and the fourth disturbing surface 232' and the indented distance g2 existing between the second base surface 21 and the third disturbing surface 231'. A second formed thickness i2' between the third and fourth disturbing surfaces 231' and 232' of the second sub disturbing portion 23', substantially equal to the second formed thickness i2 between the third and fourth disturbing surfaces 131' and 132' of the first sub disturbing portion 13'.

In FIGS. 7A, 7B, 7C and 7D, the initial, first, second and third effective area At0, At1, At2 and At3 of the middle passage P measured at the initial, first, second and third times t0, t1, t2 and t3 are substantially the same. That is to say, any effective areas cut by each sectional plane perpendicular to the first longitudinal direction N1 along the middle passage P are the same.

It is noted that two disturbing portions 13, 13' formed on the first conductive plate 1 and two disturbing portions 23, 23' formed on the second conductive plates 2 by embossing do not increase or reduce the outer area of both either side thereof, i.e., the total area of the first conductive plate 1 is equal to the second conductive plate 2.

For example, the outer area of the first base surface 11 of the first conductive plate 1, including the first disturbing surface 131 of the first main disturbing portions 13 and the peripheral extruded surfaces thereof, is equal to the outer area of the first reference surface 12 of the first conductive plate 1, including the second disturbing surface 132 of the first main disturbing portions 13 and the peripheral extruded surfaces thereof.

Referring again to FIG. 6B, an initial head loss L0 is correspondingly formed on the airflow S by the first and second conductive plates 1 and 2 as the airflow S passes through the middle passage P at the initial time t0 (plane Z0), a first head loss L0 is then correspondingly formed on the airflow S by the first conductive plate 1 and its first main disturbing portions 13, the second conductive plate 2 and its second main disturbing portion 23 as the airflow S passes through the middle passage P at the initial time t1 (plane Z1), a second head loss L2 is then correspondingly formed on the airflow S by the first conductive plate 1 and its first main disturbing portion 13, the second conductive plate 2 and its second main disturbing portion 23 as the airflow S passes through the middle passage P at the initial time t2 (plane Z2), and a third head loss L3 is then correspondingly formed on the airflow S by the first conductive plate 1 and its first sub disturbing portion 13', the second conductive plate 2 and its second sub disturbing portion 23' as the airflow S passes through the middle passage P at the initial time t3 (plane Z3).

Owing to the initial, first, second and third effective areas At0, At1, At2 and At3 of the middle passage P measured at the initial, first, second and third times t0, t1, t2 and t3 being substantially the same, it is understood that the initial head loss L0 at the initial time t0, the first head loss L1 at the first time t1, the second head loss L2 at the second time t2 and the third head loss L3 at the third time t3 are substantially the same.

No matter whether the airflow S is laminar or turbulent, speed of the airflow S passing through the middle passage P is caused to be irregular by the first main disturbing portion and the sub disturbing portion 13 and 13' of the first conductive plate 1 and the second main disturbing portion and the sub disturbing portion 23 and 23' of the second conductive plate 2, so that wideband hay-stack noise can be obtained and sound quality of the heat-dissipating structure F is improved.

It is noted that the V-shaped first main disturbing portion and the sub disturbing portion 13 and 13' increase time and distance for a leading edge of the airflow S and average convection co-efficiency (Hm), so that heat-dissipating efficiency of the heat-dissipating structure F increases. The first disturbing length m1 of the first main disturbing portions 13 and the disturbing length m2 of the disturbing portions 13' in FIG. 4 can be varied to meet different requirements.

If the first passage length W1 of the middle passage P between the first and second conductive plates 1 and 2 is short, the geometric shape of each first main/sub and second main/sub disturbing portion 13/13' and 23/23' can be substantially formed in parallel, and each protruding disturbing surface 132, 132', 232 and 232' can be formed as a slant surface or a rectangle. If the first passage length W1 of the middle passage P between the first and second conductive plates 1 and 2 is long, however, the quantity of the disturbing portions formed on the first and second conductive plates 1 and 2 can be increased, and arranged in a W-shape or other irregular shape. Thus, head loss is uniform between any passage length of the middle passage P between the first and second conductive plates 1 and 2.

Although the first and second conductive plates 1 and 2 are formed with same structure in the embodiment, i.e., the first main disturbing portion and the sub disturbing portion 13 and 13' of the first conductive plate 1 and the second main disturbing portion and the sub disturbing portion 23 and 23' of the second conductive plate 2 are correspondingly arranged, it is to be understood that the invention is not limited to the disclosed embodiments. The position and geometric shape of the first main disturbing portion and the sub disturbing portion 13 and 13' of the first conductive plate 1 as well as the second main disturbing portion and the sub disturbing portion 23 and 23' of the second conductive plate 2 can be alternatively arranged to obtain the same head loss with different time therebetween.

Figure 8:
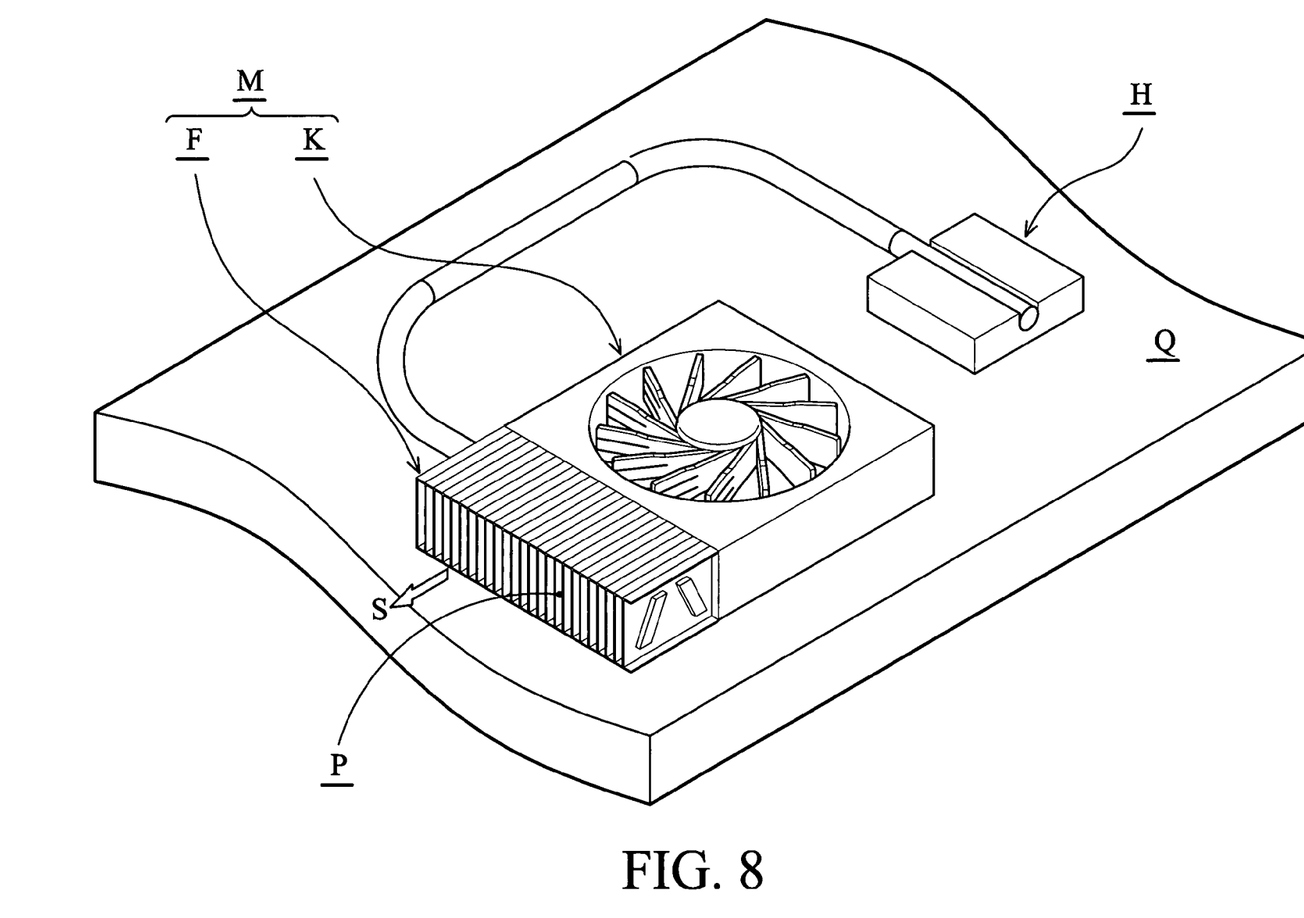
FIG. 8 is a perspective view of a heat-dissipating module (M) disposed on a heat source (H), wherein the heat-dissipating module (M) comprises a heat-dissipating structure (F) and a fan structure (K).

In FIG. 8, a heat-dissipating module M of the invention dissipates heat from a heat source H of a motherboard Q. The heat-dissipating module M comprises a fan structure K, comprising the heat-dissipating structure F mentioned above. The heat-dissipating structure F connected to the heat source H is disposed on the heat-dissipating structure F.

With the operation of the fan structure K, the airflow S passing through the middle passages P of the heat-dissipating structure F brings heat thereon to the exterior, so that time and distance for the leading edge of the airflow S, average convection co-efficiency (Hm) and heat-dissipating efficiency of the heat-dissipating structure F can be increased.

While the invention has been described in connection with what is presently considered to be the most practical and preferred embodiment, it is to be understood that the invention is not limited to the disclosed embodiments, but, on the contrary, is intended to accommodate various modifications and equivalent arrangements included within the spirit and scope of the appended claims.

What is claimed is:

1. A heat-dissipating structure, comprising:
    at least one conductive plate having a base surface, a reference surface, a first distal end, a second distal end, and an original thickness between the base surface and the reference surface; and
    at least one disturbing portion disposed on the conductive plate and located between the first and second distal ends of the conductive plate, having a first disturbing surface connected to the base surface, a second disturbing surface connected to the reference surface and a formed thickness between the first and second disturbing surfaces, wherein the formed thickness is substantially equal to the original thickness, and the disturbing portion is not connected to the first and second distal ends of the conductive plate.

2. The heat-dissipating structure as claimed in claim 1, wherein the conductive plate has a passage length extending in a longitudinal direction thereof, and the disturbing portion has a disturbing length extending in a predetermined direction unparallel to the longitudinal direction.

3. The heat-dissipating structure as claimed in claim 1, wherein the disturbing portion and the conductive plate are integrally formed.

4. The heat-dissipating structure as claimed in claim 1, wherein the disturbing portion is formed on the conductive plate by embossing from the reference surface and recessing from the base surface.

5. A heat-dissipating structure, comprising:
    at least one conductive plate having a base surface, a reference surface and an original thickness between the base surface and the reference surface; and
    at least one first main disturbing portion disposed on the conductive plate, having a first disturbing surface connected to the base surface, a second disturbing surface connected to the reference surface and a first formed thickness between the first and second disturbing surfaces, wherein the formed thickness is substantially equal to the original thickness; and
    at least one first sub disturbing portion disposed on the conductive plate, having a third disturbing surface connected to the base surface, a fourth disturbing surface connected to the reference surface and a second formed thickness between the third and the fourth disturbing surfaces, wherein the second formed thickness is substantially equal to the original thickness, and the first main disturbing portion and the first sub disturbing portion are substantially arranged in a V-shape on the conductive plate.

6. The heat-dissipating structure as claimed in claim 5, wherein the conductive plate has a passage length extending in a first longitudinal direction thereof, the first main disturbing portion has a first disturbing length extending in a first axial direction unparallel to the longitudinal direction, and the first sub disturbing portion has a second disturbing length extending in a second axial direction unparallel to the longitudinal direction.

7. The heat-dissipating structure as claimed in claim 6, wherein the first axial direction and the second axial direction intersects at an angle.

8. The heat-dissipating structure as claimed in claim 5, wherein the first main disturbing portion and the conductive plate are integrally formed.

9. The heat-dissipating structure as claimed in claim 5, wherein the first sub disturbing portion and the conductive plate are integrally formed.

10. The heat-dissipating structure as claimed in claim 5, wherein the first main disturbing portion is formed on the conductive plate by embossing.

11. The heat-dissipating structure as claimed in claim 5, wherein the first sub disturbing portion is formed on the conductive plate by embossing.

12. A heat-dissipating structure for guiding at least one airflow, comprising:
    a plurality of first conductive plates, each first conductive plate has a first base surface, a first reference surface, a first distal end, a second distal end, and a first main disturbing portion disposed on the first base surface and the first reference surface and located between the first and second distal ends, wherein the first main disturbing portion is not connected to the first and second distal ends; and
    a plurality of second conductive plates, each second conductive plate has a second base surface, a second reference surface, a third distal end, a fourth distal end, and a second main disturbing portion disposed on the second base surface and the second reference surface and located between the third and fourth distal ends, wherein the second main disturbing portion is not connected to the third and fourth distal ends, wherein a middle passage is formed between the adjacent first and second conductive plates by facing the second reference surface of the second conductive plate to the first base surface of the first conductive plate, a first flow resistance is formed when the airflow passes through the middle passage relative to the first main disturbing portion of the first conductive plate and/or the second main disturbing portion of the second conductive plate at a first reference time, a second flow resistance is formed when the airflow passes through the middle passage relative to the first main disturbing portion of the first conductive plate and/or the second main disturbing portion of the second conductive plate at a second reference time, and the first reference time is not the same as the second reference time and the first flow resistance is substantially equal to the second flow resistance.

13. The heat-dissipating structure as claimed in claim 12, wherein the first conductive plate further comprises a first original thickness between the first base surface and the first reference surface thereof, and the first main disturbing portion of the first conductive plate comprises a first formed thickness substantially equal to the first original thickness.

14. The heat-dissipating structure as claimed in claim 12, wherein the second conductive plate further comprises a second original thickness between the second base surface and the second reference surface thereof, and the second main disturbing portion of the second conductive plate comprises a second formed thickness substantially equal to the second original thickness.

15. The heat-dissipating structure as claimed in claim 12, wherein the first conductive plate further comprises a first original thickness between the first base surface and the first reference surface thereof, the first main disturbing portion of the first conductive plate comprises a first formed thickness substantially equal to the first original thickness, the second conductive plate further comprises a second original thickness between the second base surface and the second reference surface thereof, the second main disturbing portion of the second conductive plate comprises a second formed thickness substantially equal to the second original thickness, and the first original thickness is substantially equal to the second original thickness.

16. The heat-dissipating structure as claimed in claim 12, wherein the first main disturbing portion is integrally formed on the first base surface and the first reference surface, and the second main disturbing portion is integrally formed on the second base surface and the second reference surface.

17. The heat-dissipating structure as claimed in claim 12, wherein the first main disturbing portion is formed on the first base surface and the first reference surface of the first conductive plate by embossing, and the second main disturbing portion is formed on the second base surface and the second reference surface of the second conductive plate by embossing.

18. A heat-dissipating module for dissipating heat from a heat source, comprising:
a heat-dissipating structure disposed on the heat source, comprising a plurality of first conductive plates and a plurality of second conductive plates, wherein each first conductive plate has a first base surface, a first reference surface, a first distal end, a second distal end, and a first main disturbing portion disposed on the first base surface and the first reference surface and located between the first and second distal ends, and each second conductive plate has a second base surface, a second reference surface, a third distal end, a fourth distal end, and a second main disturbing portion disposed on the second base surface and the second reference surface and located between the third and fourth distal ends, wherein a middle passage is formed between the adjacent first and second conductive plates by facing the second base surface of the second conductive plate to the first reference surface of the first conductive plate, a first flow resistance is formed when the airflow passes through the middle passage relative to the first main disturbing portion of the first conductive plate and/or the second main disturbing portion of the second conductive plate at a first reference time, a second flow resistance is formed when the airflow passes through the middle passage relative to the first main disturbing portion of the first conductive plate and/or the second main disturbing portion of the second conductive plate at a second reference time, and the first reference time is not the same as the second reference time and the first flow resistance is substantially equal to the second flow resistance, wherein the first main disturbing portion is not connected to the first and second distal ends and the second main disturbing portion is not connected to the third and fourth distal ends; and
a fan structure disposed on the heat-dissipating structure.

19. The heat-dissipating module as claimed in claim 18, wherein the first main disturbing portion is formed on the first base surface and the first reference surface of the first conductive plate by embossing, and the second main disturbing portion is formed on the second base surface and the second reference surface of the second conductive plate by embossing.

20. A heat-dissipating structure, comprising:
at least one conductive plate having a base surface, a reference surface, a first distal end, a second distal end, and an original thickness between the base surface and the reference surface; and
at least one first main disturbing portion disposed on the conductive plate and located between the first and second distal ends of the conductive plate, having a first disturbing surface connected to the base surface, a second disturbing surface connected to the reference surface and a first formed thickness between the first and second disturbing surfaces, wherein the formed thickness is substantially equal to the original thickness; and
at least one first sub disturbing portion disposed on the conductive plate and located between the first and second distal ends of the conductive plate, having a third disturbing surface connected to the base surface, a fourth disturbing surface connected to the reference surface and a second formed thickness between the third and the fourth disturbing surfaces, wherein the second formed thickness is substantially equal to the original thickness, and the first main disturbing portion and the first sub disturbing portion substantially arranged in a V-shape are located between the first and second distal ends of the conductive plate.

21. The heat-dissipating structure as claimed in claim 20, wherein the first main disturbing portion and the first sub disturbing portion substantially arranged in a V-shape are not connected to the first and second distal ends of the conductive plate.

22. The heat-dissipating structure as claimed in claim 20, wherein the conductive plate has a passage length extending in a first longitudinal direction thereof, the first main disturbing portion has a first disturbing length extending in a first axial direction unparallel to the longitudinal direction, and the first sub disturbing portion has a second disturbing length extending in a second axial direction unparallel to the longitudinal direction.

23. The heat-dissipating structure as claimed in claim 20, wherein the first axial direction and the second axial direction intersects at an angle.

24. The heat-dissipating structure as claimed in claim 20, wherein the first main disturbing portion and the conductive plate are integrally formed.

25. The heat-dissipating structure as claimed in claim 20, wherein the first sub disturbing portion and the conductive plate are integrally formed.

26. The heat-dissipating structure as claimed in claim 20, wherein the first main disturbing portion is formed on the conductive plate by embossing.

27. The heat-dissipating structure as claimed in claim 20, wherein the first sub disturbing portion is formed on the conductive plate by embossing.

* * * * *